United States Patent [19]
Barcley et al.

[11] Patent Number: 5,917,149
[45] Date of Patent: Jun. 29, 1999

[54] FLEXIBLE CIRCUIT BOARD INTERCONNECT WITH STRAIN RELIEF

[75] Inventors: Tina Barcley, Rochester Hills, Mich.; Norman J. Roth, Murfreesboro, Tenn.; Vasil Germanski, Washington, Mich.; Edward T. Pokriefka, Farmington Hills, Mich.; Robert A. Isola, Royal Oak, Mich.

[73] Assignee: DaimlerChrysler Corporation, Auburn Hills, Mich.

[21] Appl. No.: 08/856,713

[22] Filed: May 15, 1997

[51] Int. Cl.$^6$ ........................ H05K 9/00
[52] U.S. Cl. .............. 174/35 C; 174/36; 439/67; 361/803
[58] Field of Search ............... 361/789, 776, 361/803, 827, 816, 818, 749; 439/67, 77; 174/35 R, 35 C, 36

[56] References Cited

U.S. PATENT DOCUMENTS

| | | | |
|---|---|---|---|
| 3,433,888 | 3/1969 | Tally et al. | 174/254 |
| 3,876,964 | 4/1975 | Balaster et al. | 333/84 M |
| 4,157,452 | 6/1979 | Pignataro et al. | 174/36 |
| 4,385,341 | 5/1983 | Main | 361/767 |
| 4,755,147 | 7/1988 | Young | 439/77 |
| 4,798,918 | 1/1989 | Kabadi et al. | 174/36 |
| 4,812,135 | 3/1989 | Smith | 439/493 |
| 4,835,394 | 5/1989 | Steele | 250/385.1 |
| 4,850,883 | 7/1989 | Kabadi | 439/67 |
| 4,860,088 | 8/1989 | Smith et al. | 439/77 |
| 4,894,015 | 1/1990 | Stockero et al. | 439/67 |
| 4,902,236 | 2/1990 | Hasircoglu | 439/77 |
| 4,906,803 | 3/1990 | Albrechta et al. | 174/254 |
| 4,991,665 | 2/1991 | Kueneman | 174/34 |
| 4,993,958 | 2/1991 | Trobough et al. | 439/91 |
| 5,036,379 | 7/1991 | Smith et al. | 257/668 |
| 5,041,015 | 8/1991 | Travis | 439/492 |
| 5,049,435 | 9/1991 | Uno et al. | 428/209 |
| 5,167,511 | 12/1992 | Krajewski et al. | 439/61 |
| 5,211,565 | 5/1993 | Krajewski et al. | 439/65 |
| 5,281,150 | 1/1994 | Bundga et al. | 439/67 |
| 5,357,084 | 10/1994 | McKee et al. | 219/605 |
| 5,387,764 | 2/1995 | Blom et al. | 174/261 |
| 5,409,384 | 4/1995 | Green et al. | 439/67 |
| 5,456,616 | 10/1995 | Fuerst et al. | 439/620 |

FOREIGN PATENT DOCUMENTS

| | | |
|---|---|---|
| 0042193 | 2/1989 | Japan . |
| 119089 | 5/1989 | Japan . |
| 0268488 | 11/1990 | Japan . |
| 404144188 | 5/1992 | Japan . |

OTHER PUBLICATIONS

IBM Technical Disclosure Bulletin, vol. 12 No. 9, Feb. 1971.
Novaflex, "Adhesiveless Interconnection System", Designed for Severe Environments, Sheldahl.

Primary Examiner—Kristine Kincaid
Assistant Examiner—Hung V Ngo
Attorney, Agent, or Firm—Roland A. Fuller III

[57] ABSTRACT

A flexible circuit board interconnect is provided with flex strain relief capabilities. The flexible circuit board interconnect includes a polyamide or polyimide (both are nylons) substrate layer, a ground plane layer and a conductor strip layer. The ground plane layer is provided with scalloped edges along opposite sides thereof. The ground plane provides a shield for preventing radio frequency interference to and from the signals passed through the conductor strips. The ground plane layer and the conductor strips are covered at least partially by a pair of soldermask layers which are provided with scalloped edges. The scalloped edges on the soldermask layers and the ground plane prevent the generation of a crease or fold line on the surface of the flexible circuit board interconnect. Each of the conductor strips are provided with a pair of vias on opposite ends of thereof. The vias are arranged to be offset from the vias on adjacent conductor strips such that a perforation-type tear line is avoided and such that when a hot bar soldering is used, at least one via remains uncovered for receiving soldering wicking, thus reducing the likelihood of solder bridging across conductor strips.

18 Claims, 5 Drawing Sheets

FLEXIBLE CIRCUIT BOARD INTERCONNECT WITH STRAIN RELIEF

BACKGROUND OF THE INVENTION

FIELD OF THE INVENTION

The present invention relates to a circuit board interconnect, and more particularly, to an improved flexible circuit board interconnect with flex strain relief.

BACKGROUND AND SUMMARY OF THE INVENTION

In the automotive and aircraft industries, on-board computer systems and computer control systems have become commonplace. With more and more of the vehicle systems becoming computer-controlled and operated, the need for connecting multiple circuit boards on a vehicle or aircraft has greatly increased over the last decade. Currently, vehicles are being provided with circuit boards which require dozens of electrical connections to be made to other circuit boards on the vehicle. Accordingly, several attempts have been made at providing electrical interconnects for connecting the vehicle circuit boards. However, these interconnects suffer from several disadvantages.

A first disadvantage of conventional interconnects is that they are susceptible to electromagnetic interference and also can generate electromagnetic interference. This electromagnetic interference can cause malfunctions in vehicle systems.

Furthermore, the conventional circuit board interconnects are often easily damaged. Repeated bending of the conventional flexible interconnects often leads to cracking or tearing.

The conventional interconnects are also difficult to assemble to the circuit boards. If the flexible circuit board interconnects are too flexible, there is often a problem with damaging the conductor strips while aligning the flexible interconnects.

Also, circuit board interconnects must provide sufficient grounding capabilities. The ground requirements for typical circuit boards can be several amperes.

Accordingly, it is an object of the present invention to provide a circuit board interconnect with flex/strain relief capabilities.

It is a further object of the present invention to provide a circuit board interconnect with sufficient ground capabilities.

It is still another object of the present invention to provide a circuit board interconnect with sufficient heat resistance and thermal process management capability.

It is still another object of the present invention to provide a circuit board interconnect with a ground shield for preventing radio-frequency interference to and from the signals passed through the circuit board interconnect.

These and other objects of the present invention are obtained by providing a flexible circuit board interconnect, including a flexible, generally flat, substrate having first and second opposing faces. A ground plane including a plurality of ground strips is disposed on the first face of the substrate. A plurality of parallel conductor strips are disposed on the second side of the substrate. A first soldermask is disposed on the first face of the substrate over top of the ground shield. A second soldermask is disposed on the second side of the substrate over top of the conductor strips. The first and second soldermask layers are provided with scalloped edges.

According to another aspect of the present invention a flexible circuit board interconnect is provided with a pair of vias through each of the copper pad strips and opposite ends of each of the conductor strips. The vias are disposed in a staggered arrangement on each of the copper pad strips.

According to still another aspect of the present invention, a flexible circuit board interconnect is provided with a ground shield made of copper disposed on the first surface of the substrate. The ground shield includes a plurality of ground strips extending from one side to a second side of the substrate.

Further areas of applicability of the present invention will become apparent from the detailed description provided hereinafter. It should be understood however that the detailed description and specific examples, while indicating preferred embodiments of the invention, are intended for purposes of illustration only, since various changes and modifications within the spirit and scope of the invention will become apparent to those skilled in the art from this detailed description.

BRIEF DESCRIPTION OF THE DRAWINGS

The present invention will become more fully understood from the detailed description and the accompanying drawings, wherein.

DETAILED DESCRIPTION OF THE PREFERRED EMBODIMENTS

Figure 1:
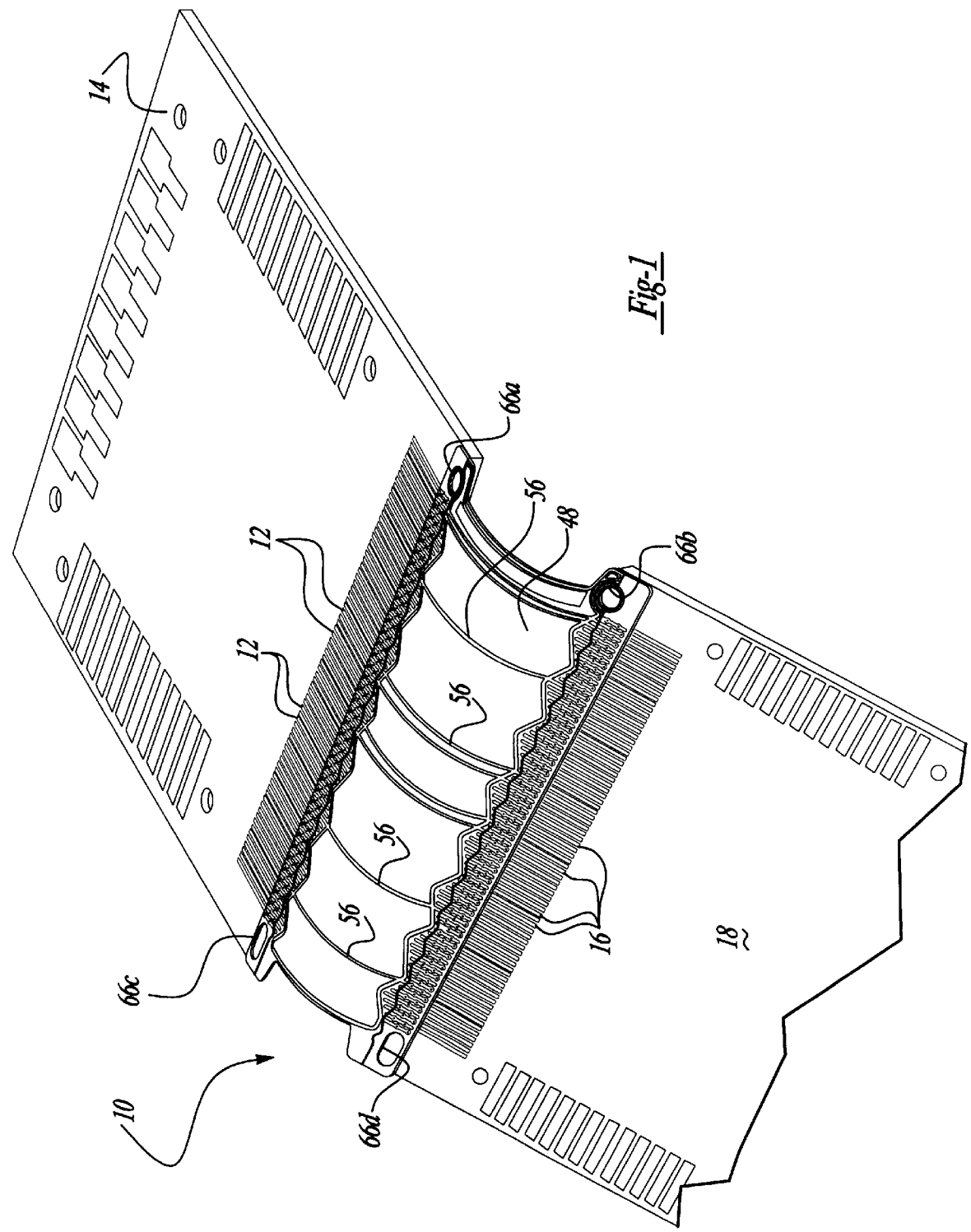
FIG. 1 is a perspective view of the circuit board interconnect of the present invention connecting contact pads on a first circuit board to corresponding contact pads on a second circuit board.

With reference to FIGS. 1–11, the flexible circuit board interconnect 10 according to the present invention will be described. FIG. 1 illustrates the flexible circuit board interconnect 10 connected to a first set of contact pads 12 of a first circuit board 14, and a second set of contact pads 16 of a second circuit board 18.

Figure 3:
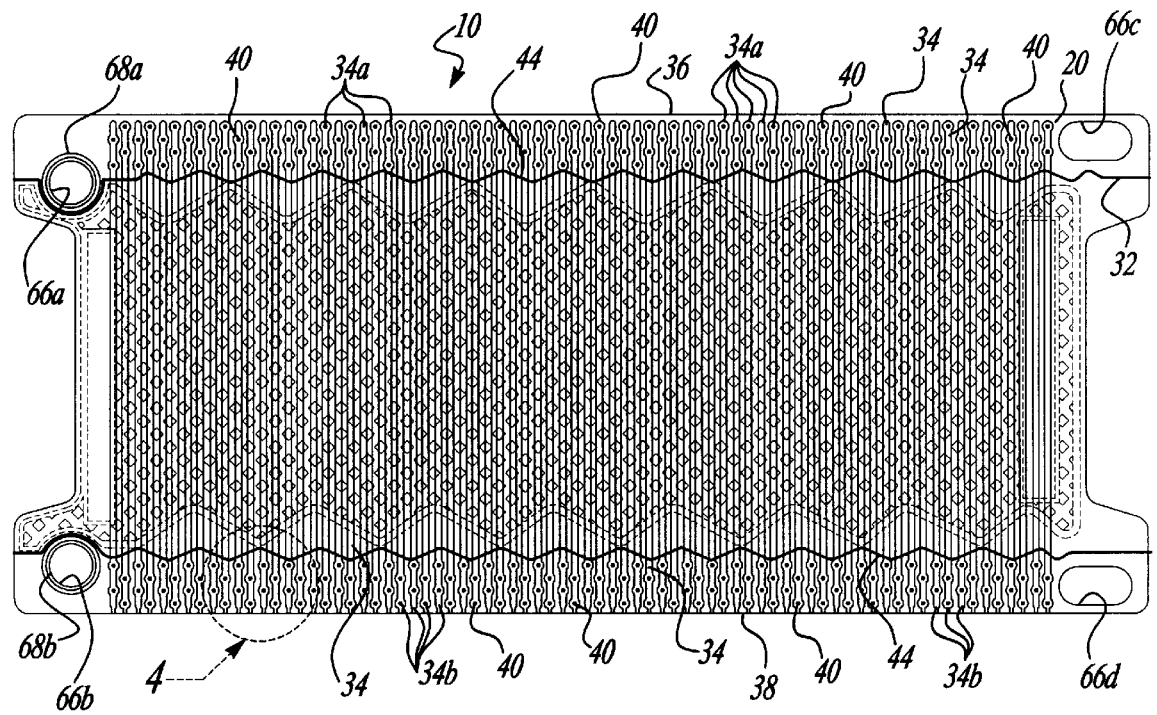
FIG. 3 is a plan view of the bottom surface of the circuit board interconnect according to the present invention.
Figure 4:
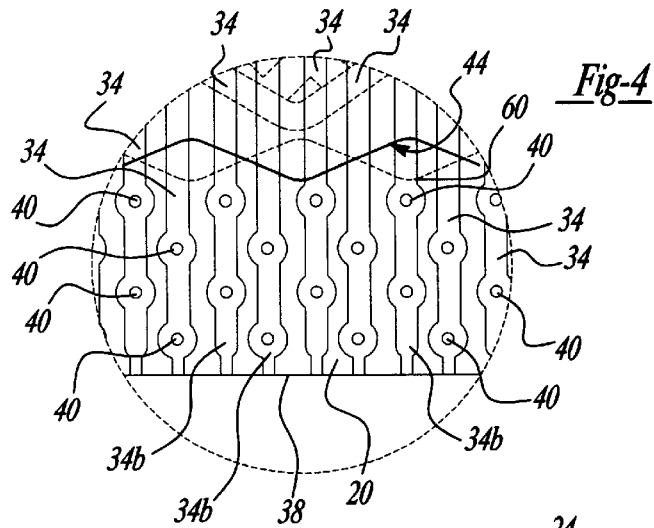
FIG. 4 is an enlarged detail view of the circled area 4 of FIG. 3, illustrating the alternating pattern of the vias provided in the ends of the conductor strips.
Figure 5:
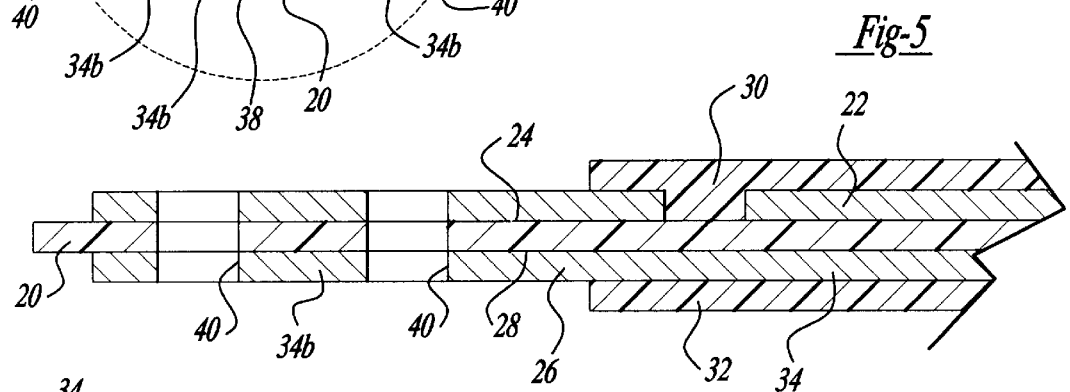
FIG. 5 is a cross-sectional view taken along line 5—5 of FIG. 2.

With reference to FIGS. 2–11, the flexible circuit board interconnect 10 according to the present invention will now be described in detail. As best seen in FIG. 5, flexible circuit board interconnect 10 includes a substrate layer 20 and a ground plane layer 22 disposed on a first surface 24 of substrate 20. A conductor strip layer 26 is provided on a second surface 28 of substrate 20. A top soldermask layer 30 is disposed on ground plane layer 22. A bottom soldermask layer 32 is disposed on conductor strip layer 26. Substrate 20 is preferably made from a nylon material, such as polyimide, for example NOVACLAD™, available from Sheldahl Corp., Northfield, Minn. 55057. However, it should be recognized that other materials having sufficient flexibility, durability, and heat resistance may be used. The top and bottom soldermask layers are formed from known soldermask materials. Preferably, the soldermask layers are made from an acrylic photo imageable curable soldermask, commercially available from DuPont Corp.

Figure 6:
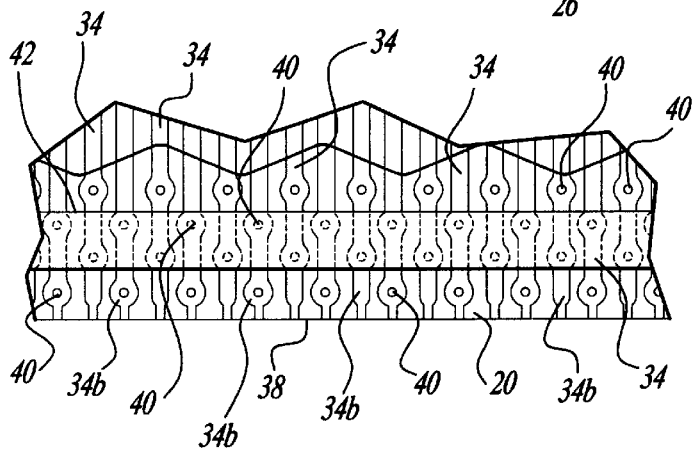
FIG. 6 is an enlarged plan view illustrating the placement of a solder bar over the centrally located vias of the conductor strips during assembly.
Figure 10:
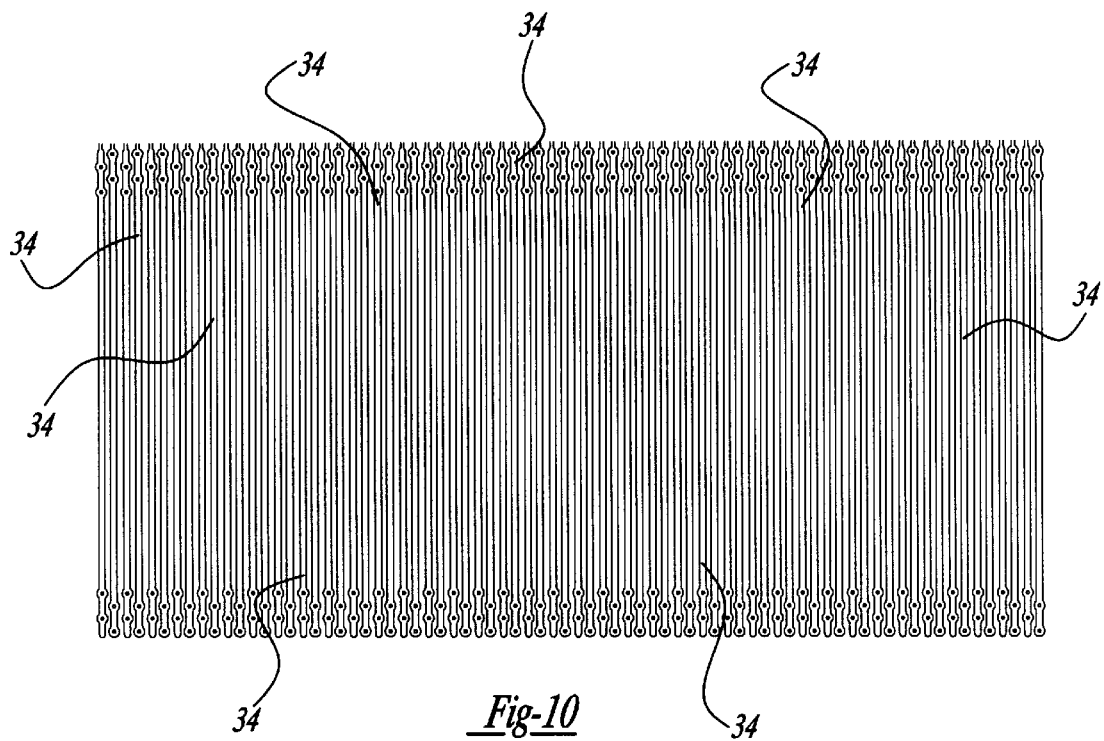
FIG. 10 is a plan view of the conductor strip layer according to the present invention.

As seen in FIGS. 3 and 10, the bottom surface of the flexible circuit board connector 10 includes the conductor strip layer 26 which includes a plurality of parallel conductor strips 34 which extend substantially from a first edge 36 of the polyimide substrate layer 20 to a second edge 38 of the polyimide substrate layer 20. Each of the conductor strips 34 include first and second ends 34a, 34b which are provided with two vias or holes 40 passing therethrough, as shown in FIG. 4. The vias 40 are disposed in an alternating offset or staggered fashion such that the vias 40 on one conductor strip 34 are not disposed next to the vias 40 on an adjacent conductor strip. Furthermore, at least one via 40 on each connector strip 34 remains uncovered when a hot bar soldering process is used. As shown in FIG. 6, a hot solder bar 42 is laid across the end portions 34a, 34b of the conductor strips in order to solder the circuit board interconnect 10 to contact pads 12 and 16 of first and second circuit boards 14, 18, respectively. The vias 40, which are not disposed under the solder bar 42, are available for soldering wicking, thus reducing the likelihood of solder bridging across conductor strips 34. In addition, because vias 40 are not aligned with one another on adjacent conductor strips 34, a perforation effect is avoided so that a breaking or folding location is not created when the flexible circuit board connector 10 is bent. Vias 40 also provide heat conduction through the substrate to lower the thermal resistance during a hot bar soldering process. Along these lines, it is sufficient if the inboardmost vias are offset from one another irrespective of the alignment of the other vias. In this way, the perforation effect is avoided.

Figure 7:
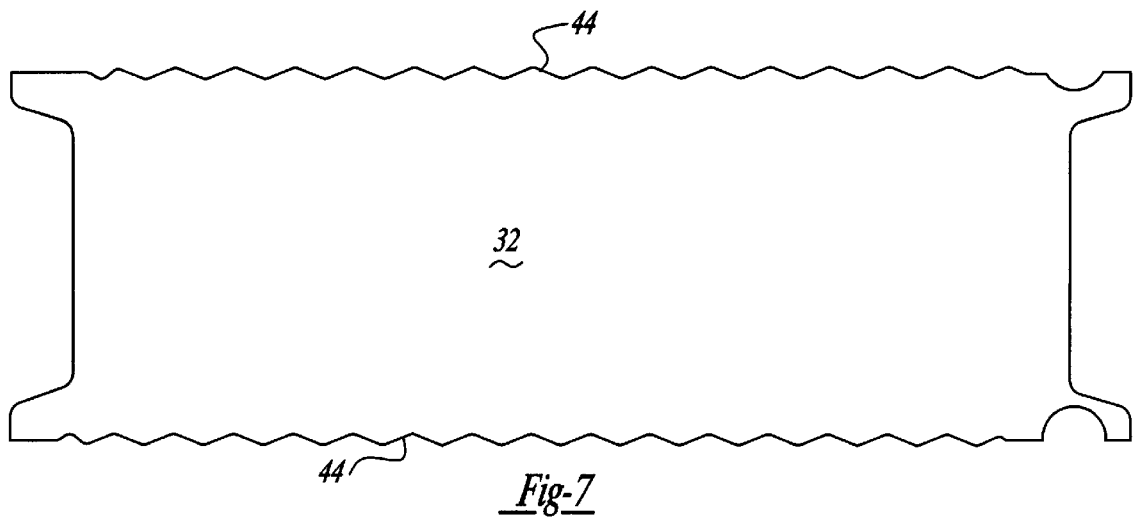
FIG. 7 is a plan view of the bottom soldermask layer according to the present invention.

A bottom soldermask layer 32 is disposed over top of the central portions of each conductor strip 34. As best seen in FIG. 7, bottom soldermask layer 32 is provided with a scalloped edge 44 corresponding with the first and second edges 36, 38 of the flexible circuit board interconnect 10.

Figure 2:
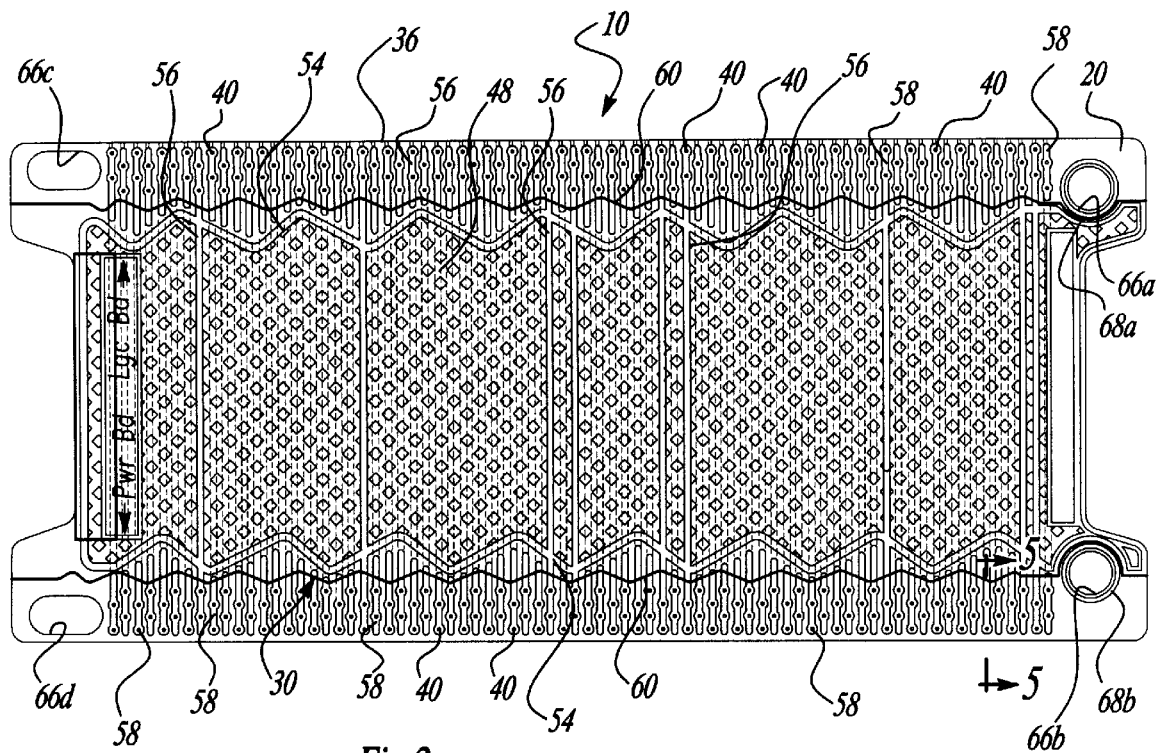
FIG. 2 is a plan view of the top surface of the circuit board interconnect according to the present invention.
Figure 8:
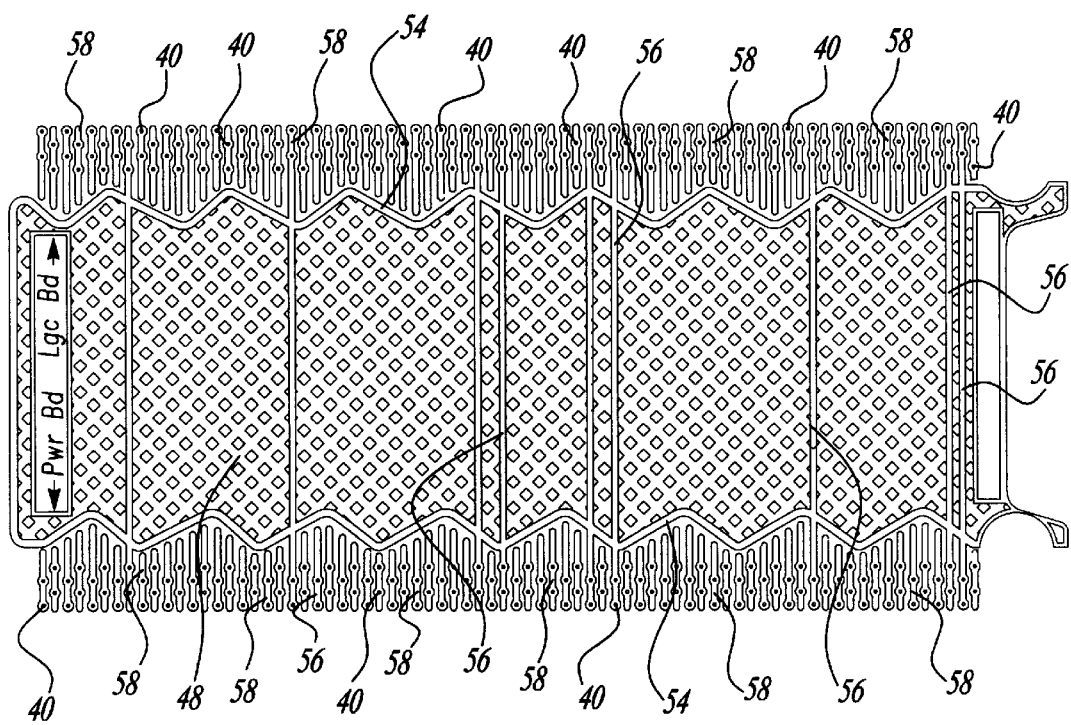
FIG. 8 is a plan view of the ground plane layer according to the present invention.
Figure 9:
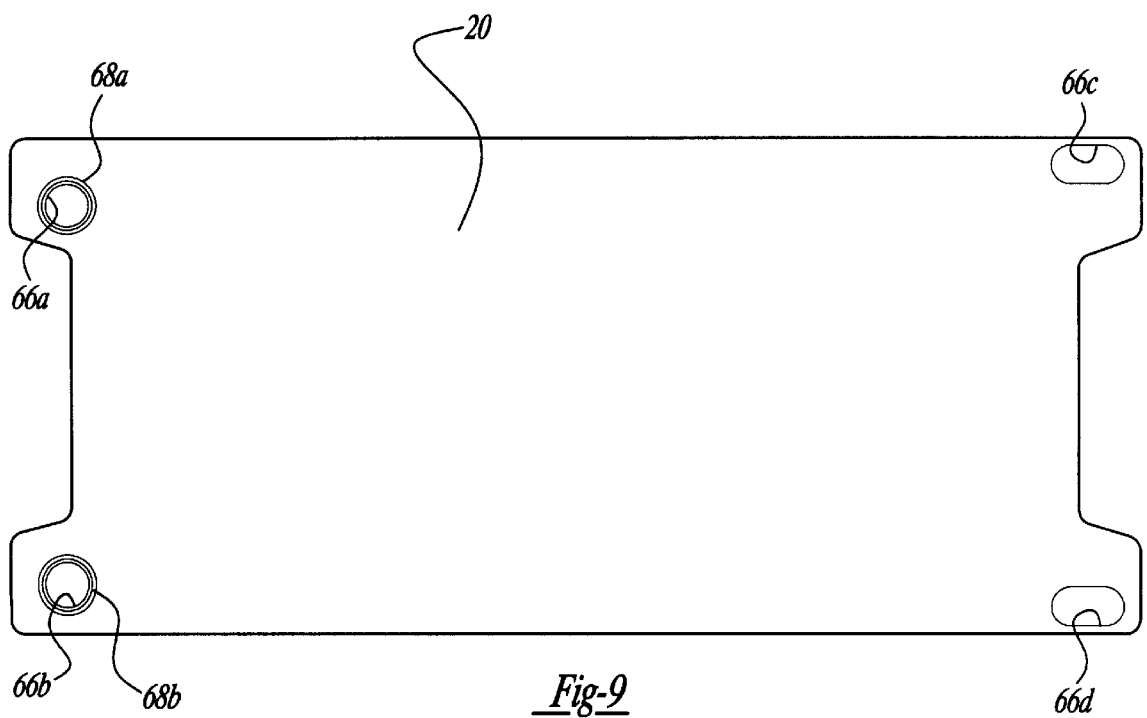
FIG. 9 is a plan view of the polyimide substrate layer according to the present invention.

With reference to FIGS. 2 and 8, the top surface of the circuit board interconnect 10 will be described. The top surface of the flexible circuit board interconnect 10 includes a ground plane layer 22 which includes a ground shield 48. Ground shield 48 preferably includes cross hatched copper strips forming a mesh-like configuration. According to the invention, the ground shield provides a low-impedance ground path across the interconnect 10, and also provides radio frequency interference shielding. The outer edges of the ground shield 48 are provided with a copper strip forming scalloped edges 54 which extend along the first and second edges 36, 38 of the flexible circuit board interconnect 10. A plurality of ground strips 56 extend from the first edge 36 to the second edge 38 of the top surface of the flexible circuit board interconnect 10. The ground strips 56 are disposed directly above corresponding interconnect strips 34 disposed on the bottom surface of flexible circuit board interconnect 10. A plurality of copper pads 58 are also disposed on the top surface of the flexible circuit board interconnect 10. The copper pads 58 are disposed opposite a corresponding conductor strip 34 disposed on the bottom surface of the flexible circuit board interconnect 10. The copper pads 58 extend from one of the first and second edges 36, 38 of the flexible circuit board interconnect 10 toward one of the scalloped edges 54 of ground shield 48 such that the copper pads 58 do not contact the ground shield 48.

Figure 11:
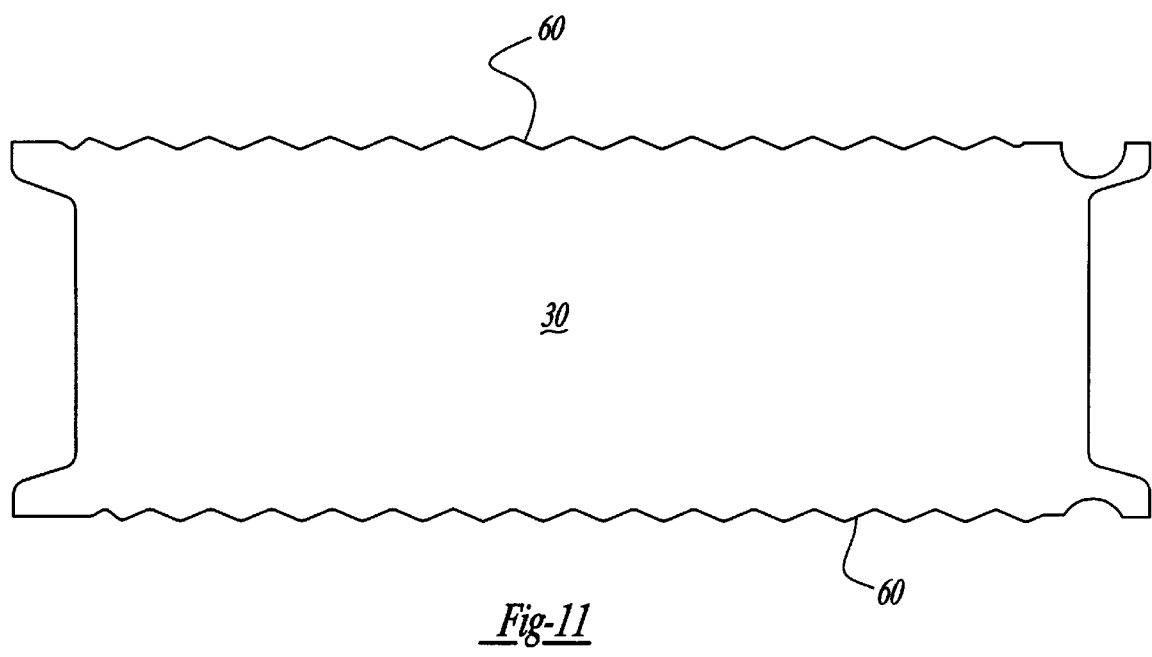
FIG. 11 is a plan view of the top soldermask layer according to the present invention.

A top soldermask layer 30 is disposed over top of ground shield 48 and partially covers the ends of a plurality of copper pad strips 58. The edges 60 of top soldermask layer 30 are scalloped, as best shown in FIG. 11. In other words, the edges 60 include a series of rounded peaks disposed on opposite sides of a series of rounded valleys. Preferably, the peaks of the scalloped edges 60 of the top soldermask layer 30 and the peaks of the scalloped edges 44 of the bottom soldermask layer 32 are 180° out of phase with one another, as best seen in FIG. 4. The scalloped edges 44 and 60 provide strain relief and eliminate the need for a separate strain relief strip typically required for interconnects of this type. The 180° phase shift reduces the likelihood of tearing along the edges 36, 38 of the circuit board interconnect 10.

The flexible circuit board interconnect 10 is provided with four guide holes 66a–66d disposed at opposite corners thereof. The guide holes 66a–66d are provided for aligning the flexible circuit board interconnect 10 relative to first and second circuit boards 14, 18. Circuit boards 14, 18 can be provided with guide pins (not shown) which are received through guide holes 66a–66b of the flexible circuit board interconnect 10. The guide holes 66a–66d can be strategically located such that the flexible circuit board interconnect 10 can only be engaged with the locator pins on the first and second circuit boards 14, 18 if the flexible circuit board interconnect 10 is in the proper orientation. Furthermore, one or more of the guide holes can be elongated to accommodate heat expansion and other manufacturing tolerances. A plurality of reinforcement rings 68a–68b are optionally provided around guide holes 66a–66b for providing additional protection against tearing of the substrate layer 20 in the area of the guide holes 66a–66b. Reinforcement rings 68a–68d can be made of copper, plastic, or another suitable material. Copper is preferably used since it is already being applied with the ground shield 48 and connector strips 34. It should be understood that the reinforcement rings 68a–68b can be utilized around each of the guide holes 66a–66d.

As discussed above, the copper ground shield 48 is provided with a plurality of ground strips 56 that connect to grounding pads on each of the circuit boards when the interconnect 10 is attached to the printed circuit boards 14, 18. The ground shield 48 can carry a certain amount of amperage per ground strip and combine with the ground shield 48 to form a ground plane. The ground shield 48 enhances electromagnetic interference reduction. Electromagnetic interference with the conductor strips 34 can cause interference with the signals passed through conductor strips 34. Ground shield 48 can be formed of a solid layer of electrically conductive material such as copper or from a mesh-like configuration of conductive material for added flexibility and weight reduction.

It should also be noted that the principles of the present invention can also be applied to a shielding mechanism utilized solely for shielding a circuit board from electromagnetic interference. According to this aspect of the invention, a shield made from conductive material is provided on a surface of a flexible substrate. The flexible substrate is mounted in a covering relationship over top of a circuit board in order to shield the circuit board from electromagnetic interference. Preferably, the shield is electrically grounded so that any electromagnetic energy absorbed by the shield can be dissipated.

The scalloped edges 60, 44, and 54 provided on the soldermask layers 30, 32 and the ground shield 48 reduce the likelihood of tearing along the edges 36, 38 of the flexible circuit board interconnect 10. For example, if the ground shield or the soldermask layers were provided with straight edges, a crease or a fold line would be built into the flexible circuit board interconnect 10. However, with the scalloped surface formed along the edges of the ground shield 48 and the soldermask layers 30, 32, the creation of a crease or fold line is avoided.

The alternating position of the vias 40 in the ends of the conductor strips 34 also avoid the effect of generating a perforation-type line across the flexible circuit board interconnect 10. In addition, by positioning the vias 40 in the ends of the conductor strips so that at least one via 40 remains uncovered in each conductor strip 34 when a hot bar soldering process is used, a hole is available for soldering wicking, thus reducing the likelihood of solder bridging across conductor strips 34.

According to a preferred embodiment, the polyimide substrate layer 20 is provided with a copper layer on first and second opposite sides thereof. The copper layers are etched away, using known processes, such that the copper conductor strips 32, the ground shield 48, and the copper pad strips 56 remain. The vias 40 are preferably drilled through the conductor strips 34, the polyimide substrate 20 and the copper pad strips 56. The soldermask layers 30, 32 can be applied before or after the vias 40 are drilled.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A flexible circuit board connector, comprising:
   a flexible substrate;
   at least one connector conductor strip disposed on a first side of said substrate;
   a first soldermask layer disposed on said first side of said substrate over top of said at least one conductor strip;
   wherein said soldermask layer has at least one scalloped edge.

2. The flexible circuit board connector according to claim 1, further comprising a grounding shield including a plurality of grounding strips disposed on a second side of said substrate.

3. The flexible circuit board connector according to claim 2, further comprising a second soldermask layer disposed on said second side of said substrate over top of said grounding shield, said second soldermask layer having at least one scalloped edge.

4. The flexible circuit board connector according to claim 3, wherein each of said first and second solder mask layers include two scalloped edges.

5. The flexible circuit board connector according to claim 4, wherein said scalloped edges of said first and second soldermask layers include a series of rounded peaks disposed on opposite sides of a series of rounded valleys, said rounded peaks of said scalloped edges of said first soldermask layer being 180 degrees out of phase with said rounded peaks of said scalloped edges of said second soldermask layer.

6. The flexible circuit board connector according to claim 2, wherein said grounding shield includes a pair of scalloped edges.

7. The flexible circuit board connector according to claim 1, wherein said at least one scalloped edge of said first soldermask layer includes a series of rounded peaks disposed on opposite sides of a series of rounded valleys.

8. The flexible circuit board connector according to claim 6, further comprising a plurality of copper pad strips disposed on said second side of said substrate, said copper pad strips extending from opposite edges of said substrate toward said scalloped edges of said grounding shield.

9. The flexible circuit board connector according to claim 1, wherein said substrate is made of nylon.

10. A flexible circuit board connector, comprising:
    a flexible substrate;
    at least one conductor strip disposed on a first side of said substrate;
    a ground shield disposed on a second side of said substrate; and
    a first soldermask layer disposed on said first side of said substrate over top of said at least one conductor strip;
    wherein said ground shield has at least one scalloped edge.

11. The flexible circuit board connector according to claim 10, wherein said at least one scalloped edge of said ground shield includes a series of rounded peaks disposed on opposite sides of a series of rounded valleys.

12. The flexible circuit board connector according to claim 10, wherein said substrate is made of nylon.

13. The flexible circuit board connector according to claim 10, further comprising a plurality of copper pad strips disposed on said second side of said substrate, said copper pad strips extending from an edge of said substrate toward said at least one scalloped edge of said ground shield.

14. The flexible circuit board connector according to claim 10, further comprising a second soldermask layer disposed on said second side of said substrate over top of said ground shield.

15. The flexible circuit board connector according to claim 14, wherein said first and second soldermask layers are provided with a pair of scalloped edges, said scalloped edges of said first and second soldermask layers including a series of rounded peaks disposed on opposite sides of a series of rounded valleys, said rounded peaks of said scalloped edges of said first soldermask layer being 180 degrees out of phase with said rounded peaks of said scalloped edges of said second soldermask layer.

16. A flexible circuit board connector, comprising:
    a flexible substrate, having first and second surfaces;
    a plurality of parallel conductor strips disposed on said first surface of said substrate; and
    at least one strain relief plane disposed on one of said first and second surfaces, said strain relief plane including a pair of oppositely disposed scalloped edges extending generally perpendicular to said plurality of parallel conductor strips.

17. The flexible circuit board connector according to claim 16, wherein said strain relief plane is a soldermask layer.

18. The flexible circuit board connector according to claim 16, wherein said strain relief plane is a ground shield.

* * * * *